(12) United States Patent
Jang et al.

(10) Patent No.: US 12,249,976 B2
(45) Date of Patent: Mar. 11, 2025

(54) POWER SWITCH CIRCUIT AND NON-VOLATILE MEMORY DEVICE COMPRISING THE SAME

(71) Applicant: Samsung Electronics Co., Ltd., Suwon-si (KR)

(72) Inventors: Jung Kyu Jang, Hwaseong-si (KR); Suk-Soo Pyo, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 193 days.

(21) Appl. No.: 18/050,489

(22) Filed: Oct. 28, 2022

(65) Prior Publication Data

US 2023/0142636 A1    May 11, 2023

(30) Foreign Application Priority Data

Nov. 11, 2021    (KR) .......................... 10-2021-0154576

(51) Int. Cl.
*G11C 16/30*    (2006.01)
*H03K 17/0812*    (2006.01)

(52) U.S. Cl.
CPC ....... *H03K 17/08122* (2013.01); *G11C 16/30* (2013.01)

(58) Field of Classification Search
CPC ... G11C 16/30; G11C 13/0038; G11C 11/413; G11C 11/4074; G11C 11/2297; G11C 11/1697; G11C 5/14–148; H03K 17/08122
See application file for complete search history.

(56) References Cited

U.S. PATENT DOCUMENTS

| | | | |
|---|---|---|---|
| 6,603,328 B2 | 8/2003 | Takahashi et al. | |
| 6,759,701 B2 | 7/2004 | Shimizume | |
| 7,362,126 B1 * | 4/2008 | Wert ................. | H03K 17/6874 |
| | | | 326/23 |
| 9,558,696 B2 | 1/2017 | Son et al. | |
| 9,564,888 B2 | 2/2017 | Ham et al. | |
| 9,722,597 B2 | 8/2017 | Lee | |

FOREIGN PATENT DOCUMENTS

| | | |
|---|---|---|
| JP | 3519284 B2 | 4/2004 |
| KR | 20000015676 A | 3/2000 |
| KR | 100412994 B1 | 12/2003 |
| KR | 100715601 B1 | 5/2007 |
| KR | 20140079008 A | 6/2014 |
| KR | 20160074163 A | 6/2016 |

* cited by examiner

*Primary Examiner* — Alfredo Bermudez Lozada
(74) *Attorney, Agent, or Firm* — Myers Bigel, P.A.

(57) ABSTRACT

A power switch circuit and non-volatile memory device including the same are provided. The power switch circuit includes a multi-voltage providing circuit configured to receive a first voltage and a second voltage greater than the first voltage, output a third voltage corresponding to the first voltage to a first output terminal, and output a fourth voltage corresponding to the second voltage to a second output terminal. The power switch circuit also includes a leakage current prevention circuit configured to cut off a leakage current flowing through the multi-voltage providing circuit. The multi-voltage providing circuit includes a first inverter which is driven using the second voltage. The leakage current prevention circuit is configured to cut off the leakage current flowing through the first inverter in response to both the first voltage and the second voltage being provided to the multi-voltage providing circuit.

20 Claims, 10 Drawing Sheets

POWER SWITCH CIRCUIT AND NON-VOLATILE MEMORY DEVICE COMPRISING THE SAME

This application claims priority from Korean Patent Application No. 10-2021-0154576 filed on Nov. 11, 2021, in the Korean Intellectual Property Office, the disclosure of which is incorporated herein by reference in its entirety.

BACKGROUND

1. Technical Field

The present disclosure relates to power switch circuits and non-volatile memory devices including the same.

2. Description of the Related Art

A semiconductor device that uses a power voltage of high voltage and a power voltage of low voltage for operation is used. For example, a non-volatile memory device, which is an example of the semiconductor device, may perform a read operation and a write operation, using the power voltage of high voltage and the power voltage of low voltage.

Incidentally, when only the power voltage of high voltage is applied to a semiconductor device such as a memory device without the power voltage of low voltage, a problem may occur when the semiconductor device performs a required operation. Therefore, research for preventing this problem is being conducted.

SUMMARY

Aspects of the present disclosure include a power switch circuit that prevents only the power voltage of high voltage from being provided and is able to reduce a leakage current.

Aspects of the present disclosure also include a non-volatile memory device including the power switch circuit that prevents only the power voltage of high voltage from being provided and is able to reduce a leakage current.

According to some aspects of the present disclosure, a power switch circuit comprises: a multi-voltage providing circuit configured to receive a first voltage and a second voltage greater than the first voltage, output a third voltage corresponding to the first voltage to a first output terminal, and output a fourth voltage corresponding to the second voltage to a second output terminal; and a leakage current prevention circuit configured to cut off a leakage current flowing through the multi-voltage providing circuit, wherein the multi-voltage providing circuit comprises a first inverter which is driven using the second voltage, and wherein the leakage current prevention circuit is configured to cut off the leakage current flowing through the first inverter in response to both the first voltage and the second voltage being provided to the multi-voltage providing circuit.

According to some aspects of the present disclosure, a power switch circuit comprises: a multi-voltage providing circuit configured to receive a first voltage and a second voltage greater than the first voltage, output a third voltage, corresponding to the first voltage to a first output terminal, output a fourth voltage corresponding to the second voltage to a second output terminal, wherein the multi-voltage providing circuit comprises a first inverter which is driven using the second voltage; and a leakage current prevention circuit configured to cut off a leakage current flowing through the first inverter using a pull-down resistance value determined based on a voltage level of an input node of the first inverter.

According to some aspects of the present disclosure, a non-volatile memory device comprises: a power switch circuit configured to receive a first voltage and a second voltage greater than the first voltage, output a third voltage corresponding to the first voltage to a first output terminal, and output a fourth voltage corresponding to the second voltage to a second output terminal; and a voltage generator configured to receive the third voltage through the first output terminal, receive the fourth voltage through the second output terminal, and generate an operating voltage for reading and/or writing data on a memory cell based on the third voltage and the fourth voltage, wherein the power switch circuit comprises: a first inverter which is driven using the second voltage; and a leakage current prevention circuit configured to reduce or inhibit a leakage current flowing through the first inverter using a pull-down resistance value determined based on a voltage level of an input node of the first inverter.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail exemplary embodiments thereof referring to the attached drawings, in which.

DETAILED DESCRIPTION OF THE EMBODIMENTS

Hereinafter, embodiments according to the technical idea of the present disclosure will be described referring to the accompanying drawings.

Figure 1:
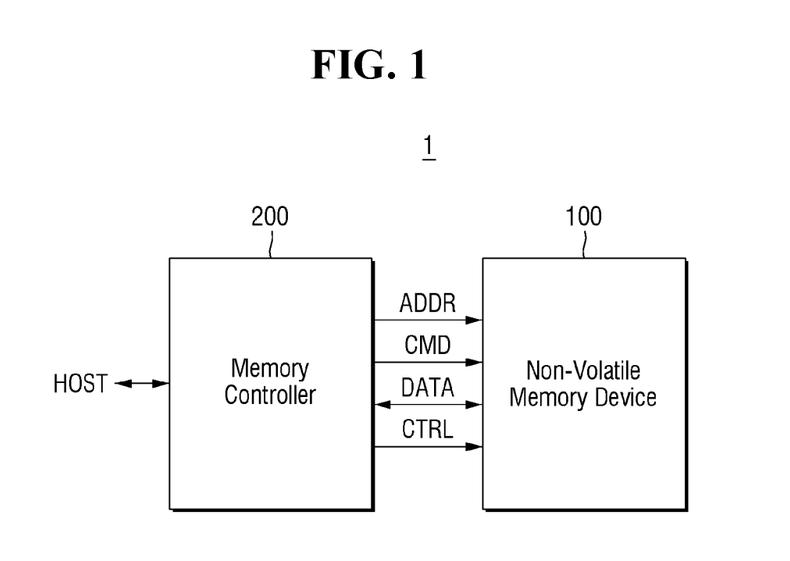
FIG. 1 is a block diagram illustrating a non-volatile memory system according to some embodiments.

FIG. 1 is a block diagram for illustrating a non-volatile memory system according to some embodiments.

Referring to FIG. 1, the non-volatile memory system 1 includes a memory controller 200 and a non-volatile memory device 100. Examples of the non-volatile memory system shown in FIG. 1 may include a data storage medium based on a flash memory such as a memory card, a USB memory, and an SSD (Solid State Drive), but the embodiments are not limited to these examples.

The memory controller 200 may be connected to a host and the non-volatile memory device 100. The memory controller 200 may be configured to access the non-volatile memory device 100 in response to a request from the host, as shown. The memory controller 200 may be configured to provide an interface between the non-volatile memory device 100 and the host. Further, the memory controller 200 may be configured to drive firmware for controlling the non-volatile memory device 100.

The memory controller 200 may control the operation of the non-volatile memory device 100. Specifically, the memory controller 200 may provide a command CMD, an address ADDR, a control signal CTRL, and data DATA along one or more input/output line(s) connected to the non-volatile memory device 100.

The control signal CTRL provided by the memory controller 200 to the non-volatile memory device 100 may include, for example, a chip enable (CE), a write enable (WE), a read enable (RE), and the like. However, the embodiments are not limited thereto.

The memory controller 200 may include an ECC circuit that corrects error bits. The ECC circuit may perform correction of error bits included in the data. However, the embodiments are not limited thereto, and the ECC circuit may be provided as a component of the non-volatile memory device 100, if necessary.

The memory controller 200 and the non-volatile memory device 100 may be provided as a single chip, a single package, a single module, or the like, respectively. Alternatively, the memory controller 200 and the non-volatile memory device 100 may be implemented, for example, using packages such as a PoP (Package on Package), Ball Grid arrays (BGAs), Chip scale packages (CSPs), a Plastic Leaded Chip Carrier (PLCC), a Plastic Dual In-Line Package (PDIP), a Die in Waffle Pack, a Die in Wafer Form, a Chip On Board (COB), a Ceramic Dual In-Line Package (CERDIP), a Plastic Metric Quad Flat Pack (MQFP), a Thin Quad Flatpack (TQFP), a Small Outline (SOIC), a Shrink Small Outline Package (SSOP), a Thin Small Outline (TSOP), a Thin Quad Flatpack (TQFP), a System In Package (SIP), a Multi Chip Package (MCP), a Wafer-level Fabricated Package (WFP), and a Wafer-Level Processed Stack Package (WSP).

Hereinafter, the configuration of the non-volatile memory device 100 will be described more specifically referring to FIG. 2.

Figure 2:
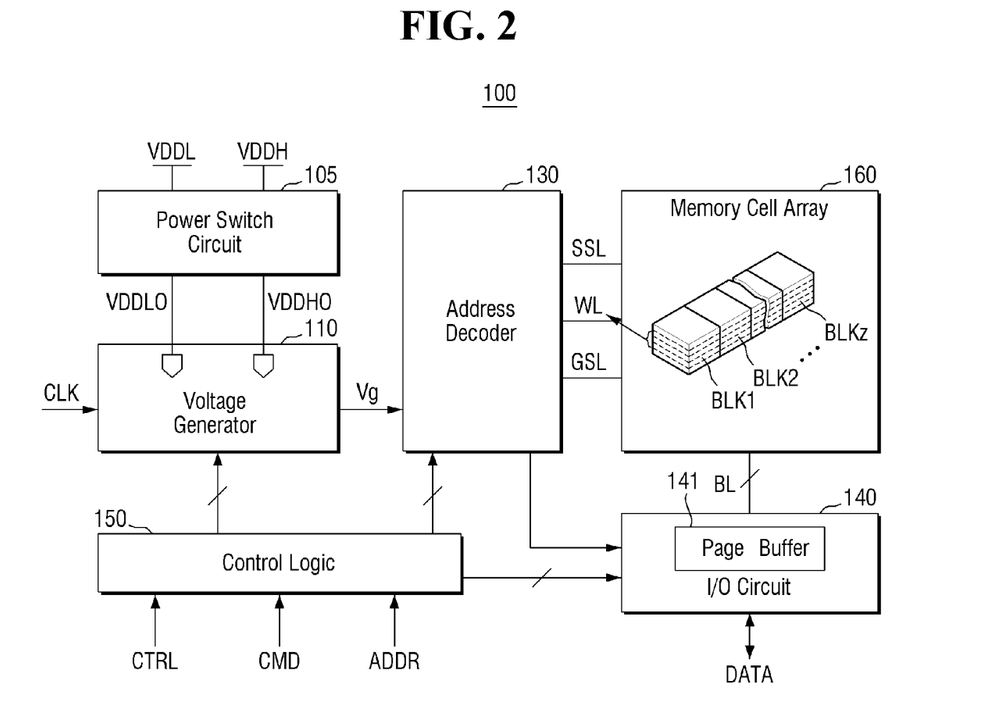
FIG. 2 is a block diagram for illustrating a non-volatile memory device, like the one shown in FIG. 1.

FIG. 2 is a block diagram for illustrating a non-volatile memory device, like the one shown in FIG. 1.

Referring to FIG. 2, the non-volatile memory device 100 may include a power switch circuit 105, a voltage generator 110, an address decoder 130, an input/output circuit 140, a controller 150, and a memory cell array 160.

The non-volatile memory device 100 may include, for example, a NAND flash memory, a vertical NAND flash memory (Vertical NAND; VNAND), a NOR flash memory, a resistive RAM (Resistive Random Access Memory: RRAM), a phase-change memory (PRAM), a magneto resistive random access memory (MRAM), a ferroelectric random access memory (FRAM), a spin transfer torque random access memory (STT-RAM), and the like, but the embodiments are not limited to these examples.

In some embodiments, the non-volatile memory device 100 may be a magneto resistive memory, but the embodiments are not limited thereto.

The power switch circuit 105 receives a power voltage VDDL (which may be referred to a low power voltage) and a power voltage VDDH (which may be referred to as a high power voltage), and may output a power voltage VDDLO corresponding to the power voltage VDDL and a power voltage VDDHO corresponding to the power voltage VDDH.

In some embodiments, the power voltage VDDLO may be substantially the same as the power voltage VDDL, and the power voltage VDDHO may be substantially the same as the power voltage VDDH. In other embodiments, the power voltage VDDLO may have a magnitude that is a defined ratio of the magnitude of the power voltage VDDL, and the power voltage VDDHO may have a magnitude that is a defined ratio of the magnitude of the power voltage VDDH.

The power voltage VDDH (and thus the power voltage VDDHO) may be greater in magnitude than the power voltage VDDL (and thus the power voltage VDDLO). For example, when the power voltage VDDL is 1V, the power voltage VDDH may be 1.8V, but the embodiment is not limited thereto.

In some embodiments, the power switch circuit 105 may perform power gating that cuts off the power voltage provided to the non-volatile memory device 100 when the non-volatile memory device 100 operates in a sleep mode.

For example, the power switch circuit 105 may cut off the provision of the power voltage VDDLO to the non-volatile memory device 100 when the non-volatile memory device 100 operates in the sleep mode. Since the power voltage VDDLO is not provided to the non-volatile memory device 100, the power voltage VDDHO may also not be provided to the non-volatile memory device 100 by the power switch circuit 105.

In some embodiments, the power switch circuit 105 may prevent only the power voltage VDDHO from being solely provided to the non-volatile memory device 100.

For example, when only the power voltage VDDH is provided and the power voltage VDDL is not provided to the power switch circuit 105, if the power switch circuit 105 does not output the power voltage VDDLO and outputs only the power voltage VDDHO, there may be problems in the internal operation of the non-volatile memory device 100. Therefore, when only the power voltage VDDH is provided and the power voltage VDDL is not provided to the power switch circuit 105, the power switch circuit 105 cuts off the power voltage VDDHO so that only the power voltage VDDHO is not solely provided to the non-volatile memory device 100.

In some embodiments, when both the power voltage VDDH and the power voltage VDDL are provided to the power switch circuit 105, the power switch circuit 105 may cut off the leakage current flowing through the power switch circuit 105 to reduce the leakage current. As used herein, the term "cut off the leakage current" or similar language may mean that the leakage current is completely eliminated, or it may mean that the leakage current is reduced or inhibited to an extent that it does not significantly affect the operation of the non-volatile memory device comprising the power switch device.

A more specific description of the operation of such a power switch circuit 105 will be provided later.

The voltage generator 110 may generate an operating voltage Vg required for the operation of the non-volatile memory device 100 using the power voltage VDDLO and the clock signal CLK provided from the power switch circuit 105. Examples of such an operating voltage Vg may include a program voltage, a pass voltage, a read voltage, a read pass voltage, a verification voltage, an erasure voltage, a common source line voltage, a well voltage, and the like, but the embodiments are not limited thereto.

The voltage generator 110 may generate a word line voltage that is required to program new data in a memory cell placed in the memory cell array 160, read the data stored in the memory cell, and erase the data stored in the memory cell.

The address decoder 130 may select any one of a plurality of memory blocks BLK1 to BLKz in the memory cell array 160 in response to the address ADDR. Further, the address decoder 130 may be connected to the memory cell array 160 through a plurality of word lines WL, at least one string selection line SSL, and at least one ground selection line GSL.

The address decoder 130 may select the word line WL, the string selection line SSL, and the ground selection line GSL, using the decoded row address. Further, the address decoder 130 may decode the column address among the input addresses. Here, the decoded column address may be transmitted to the input/output circuit 140. In some embodiments, the address decoder 130 may include a row decoder, a column decoder, an address buffer, and the like.

The input/output circuit 140 may be connected to the memory cell array 160 through the bit line BL. The input/output circuit 140 may be implemented to receive the column address decoded from the address decoder 130. The input/output circuit 140 may select the bit lines BL, using the decoded column address.

The input/output circuit 140 may include a plurality of page buffers 141 that store data to be programmed when the non-volatile memory device 100 performs a program operation, or store data read when performing a read operation. Here, each of the plurality of page buffers 141 may include a plurality of latches.

At the time of the program operation, the data stored in the plurality of page buffers 141 may be programmed into the page (for example, a set of memory cells) corresponding to the selected memory block through the bit line BL. The data that is read from the page corresponding to the selected memory block at the time of the read operation may be stored in the page buffer 141 through the bit line BL.

When the address decoder 130 applies the program word line voltage to the selected word line WL at the time of the program operation, the input/output circuit 140 operates as a write driver, and may apply a program bit line voltage, such as a program prohibit voltage, program forcing voltage, and a program voltage to the bit lines BL connected to the memory cell. However, the embodiments are not limited thereto, and the shown configuration may be modified as much as possible.

On the other hand, the input/output circuit 140 may read data from a first region of the memory cell array 160 and store the read data in a second region of the memory cell array 160. For example, the input/output circuit 140 may be implemented to perform copy-back.

The controller 150 may control the overall operation (program, read, erase, etc.) of the non-volatile memory device 100. Specifically, the controller 150 may control the operation of the voltage generator 110, the address decoder 130, and the input/output circuit 140 while the non-volatile memory device 100 is operating. The controller 150 may operate in response to control signals CTRL or command CMD that are input from outside, such as from an external device. Although the drawing shows only a configuration in which the controller 150 controls the operation of the voltage generator 110, the address decoder 130, and the input/output circuit 140, the embodiments are not limited thereto. If desired, the non-volatile memory device 100 may include more components in addition to the components shown, and the controller 150 may control the overall operations of these components.

The memory cell array 160 may include, for example, a plurality of magneto resistive memory cells. Further, the memory cell array 160 may be implemented as, for example, a three-dimensional memory array structure. The three-dimensional memory array has directionality in a vertical direction, and may include a plurality of vertical NAND strings in which at least one memory cell is located above the other memory cell. At least one memory cell may include, for example, a charge trap layer. Each vertical NAND string may include at least one selection transistor located above the memory cells. At least one selection transistor has the same structure as the memory cells, and may be monolithically formed together with the memory cell. The term monolithic means that the layers of each level of the 3D array are deposited directly on the layers of a lower level of the 3D array.

A three-dimensional memory array is made up of multiple levels, and shared word lines or bit lines may be placed between the levels. The non-volatile memory device 100 may be flash memory devices in which the charge storage layer is formed of a conductive floating gate, or may be a charge trap flash (CTF) memory device in which the charge storage layer is formed of an insulating film.

The memory cell array 160 may include a plurality of memory blocks BLK1 to BLKz. Each of the memory blocks BLK1 to BLKz is connected to the address decoder 130 through a plurality of word lines WL, at least one string selection line SSL, and at least one ground selection line GSL, and may be connected to the input/output circuit 140 through the plurality of bit lines BL. In some embodiments, the plurality of word lines WL may have a stacked plate-like structure.

Each of the plurality of memory blocks BLK1 to BLKz may include multiple strings of a dimensional structure which are arranged on a substrate along a first direction and a second direction different from the first direction, and arranged in a third direction perpendicular to a plane formed by the first and second directions. Here, each of the plurality of strings may be made up of at least one string selection transistor connected in series between the bit line and the common source line (CSL), a plurality of memory cells, and at least one ground selection transistor. Here, each of the plurality of memory cells may store at least one bit. In some embodiments, at least one dummy cell may be included between at least one string selection transistor and the plurality of memory cells. In some embodiments, at least one dummy cell may be included between the plurality of memory cells and at least one ground selection transistor.

Figure 3:
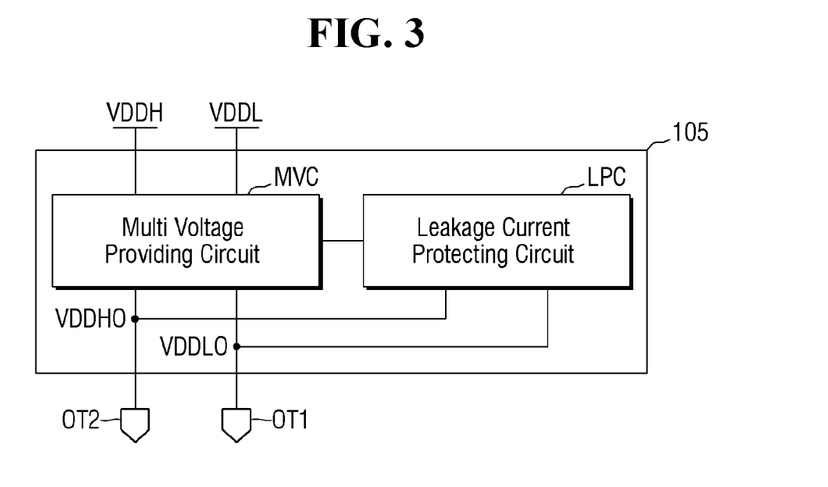
FIG. 3 is a block diagram of a power switch circuit, like the one shown in FIG. 2.
Figure 4:
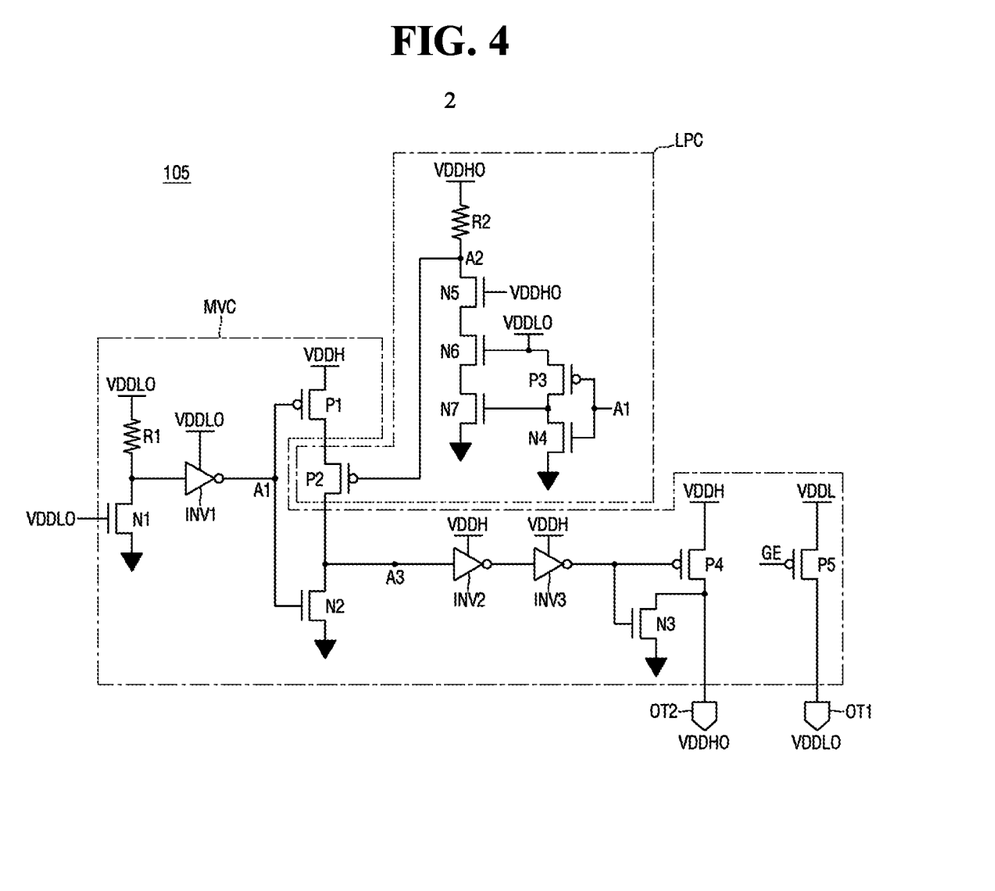
FIG. 4 is a circuit diagram of the power switch circuit of FIG. 2.

FIG. 3 is a block diagram of a power switch circuit, like the one shown in FIG. 2. FIG. 4 is a circuit diagram of the power switch circuit of FIG. 2.

Referring to FIG. 3, the power switch circuit 105 may include a multi-voltage providing circuit MVC and a leak current prevention circuit LPC.

The multi-voltage providing circuit MVC may receive the power voltage VDDL and the power voltage VDDH, output a power voltage VDDLO corresponding to the power voltage VDDL to an output terminal OT1, and output a power voltage VDDHO corresponding to the power voltage VDDH to an output terminal OT2.

The leakage current prevention circuit LPC may cut off the leakage current flowing through the multi-voltage providing circuit MVC using the power voltage VDDLO and the power voltage VDDHO. For example, the leakage current prevention circuit LPC may cut off the leakage current flowing through the multi-voltage providing circuit MVC when the power voltage VDDLO is output to the output terminal OT1 and the power voltage VDDHO is output to the output terminal OT2.

Referring to FIG. 4, the multi-voltage providing circuit MVC may include a resistor R1, a plurality of the transistors N1, P1, N2, N3, P4 and P5, and a plurality of inverters INV1, INV2 and INV3.

A source terminal of the transistor N1 is grounded, the power voltage VDDLO is provided to a gate terminal of the transistor N1, and the transistor N1 may be turned on based on the power voltage VDDLO.

The resistor R1 may be connected between the power voltage VDDLO and the transistor N1. An inverter INV1 may be driven using the power voltage VDDLO.

A voltage level of the node A1 may be determined by a pull-down resistance value generated by turning on the transistor N1 by the power voltage VDDLO.

For example, when the transistor N1 is turned on in response to application of the power voltage VDDLO, since a voltage level of an input node of the inverter INV1 becomes a low level (for example, a logical low level, hereinafter indicated by L) due to the pull-down resistance value generated by the transistor N1, and the inverter INV1 is driven by the power voltage VDDLO, the voltage level of the node A1 may become a high level (for example, a logical high level, hereinafter indicated by H).

In contrast, when the transistor N1 is turned off in response to the application of the power voltage VDDLO, since the voltage level of the input node of the inverter INV1 becomes a low level L, and the inverter INV1 also does not operate, the voltage level of the node A1 may also become a low level L.

The source terminal of the transistor P1 may be connected to the power voltage VDDH, and the gate terminal of the transistor P1 may be connected to the node A1. The source terminal of the transistor N2 is grounded and the gate terminal of the transistor N2 may be connected to the node A1.

The transistor P1 and the transistor N2 may operate as an inverter that inverts the voltage level of the node A1 and outputs the voltage level to the node A3.

When the voltage level of the node A1 is the low level L, the transistor P1 is turned on, the transistor N2 is turned off, and the voltage level of the node A3 becomes a high level H of the power voltage VDDH level.

In contrast, when the voltage level of the node A1 is the high level H, the transistor P1 is turned off, the transistor N2 is turned on, and the voltage level of the node A3 becomes the low level L. Incidentally, at this time, the power voltage VDDLO is provided to the gate terminal of the transistor P1, but the power voltage VDDH larger than that is provided to the source terminal of the transistor P1. Accordingly, there may be a situation in which the transistor P1 is not completely turned off. If the transistor P1 is not completely turned off in this way, a leakage current flowing inside the inverter including the transistor P1 and the transistor N2 may occur.

The leakage current prevention circuit LPC may perform an operation of cutting off such a leakage current.

The leakage current prevention circuit LPC may include a resistor R2 and a plurality of transistors N4, N5, N6, N7, P2 and P3.

A source terminal of a transistor P3 is connected to the power voltage VDDLO, and a gate terminal of the transistor P3 may be connected to the node A1. A source terminal of a transistor N4 is grounded and a gate terminal of the transistor N4 may be connected to the node A1.

A source terminal of a transistor N7 is grounded, and a gate terminal of the transistor N7 may be connected to the drain terminal of the transistor P3 and the drain terminal of the transistor N4. A source terminal of a transistor N6 is connected to the drain terminal of the transistor N7, and a gate terminal of the transistor N6 may be connected to the power voltage VDDLO. A source terminal of a transistor N5 is connected to the drain terminal of the transistor N6, and a gate terminal of the transistor N5 may be connected to the power voltage VDDHO.

The transistor N7 may be turned on by the voltage level of the node A1 to generate a pull-down resistance value. The transistor N6 may be turned on by the voltage level of the node A1 to generate a pull-down resistance value. The transistor N5 may be turned on by the power voltage VDDHO to generate a pull-down resistance value.

That is, the voltage level of a node A2 may be determined by the pull-down resistance values generated by turning on the transistors N5, N6, and N7.

For example, when the transistors N5, N6, and N7 are turned on, the voltage level of the node A2 may become the low level L by the pull-down resistance values generated by the transistors N5, N6, and N7.

In contrast, when the transistors N5, N6, and N7 are turned off, the voltage level of the node A2 may become the high level H of the power voltage VDDHO level.

The source terminal of the transistor P2 is connected to the drain terminal of the transistor P1, the drain terminal of the transistor P2 is connected to the drain terminal of the transistor N2, and the gate terminal of the transistor P2 may be connected to the node A2.

The transistor P2 may be turned off to cut off the leakage current flowing into the inverter including the transistor P1 and the transistor N2.

The inverter INV2 and the inverter INV3 may be driven using the power voltage VDDH. The inverter INV2 may invert the voltage level of the node A3 and transfer it to the inverter INV3, and the inverter INV3 may invert the output of the inverter INV2 and provide it to the gate terminals of the transistor P4 and the transistor N3.

In some embodiments, the inverter INV2 and the inverter INV3 may be omitted as needed.

The source terminal of the transistor P4 is connected to the power voltage VDDH, the drain terminal of the transistor P4 is connected to the output terminal OT2, and the gate terminal of the transistor P4 may be connected to the output of the inverter INV3.

The source terminal of the transistor N3 is grounded, the drain terminal of the transistor N3 is connected to the drain terminal of the transistor P4, and the gate terminal of the transistor N3 may be connected to the outside of the inverter INV3.

The source terminal of the transistor P5 is connected to the power voltage VDDL, the drain terminal of the transistor P5 is connected to the output terminal OT1, and the gating enable signal GE may be provided to the gate terminal of the transistor P5.

First, the power gating operation of the power switch circuit 105 will be described.

Referring to FIGS. 2 and 4, when the non-volatile memory device 100 operates in a sleep mode, the gating enable signal GE of the high level H is provided to the gate terminal of the transistor P5. As a result, the transistor P5 is turned off, and the power voltage VDDLO is no longer output to the output terminal OT1.

When the power voltage VDDLO is no longer output to the output terminal OT1, the voltage level of the node A1 becomes the low level L, the voltage level of the node A3 becomes the high level H, the transistor N3 is turned on, and the transistor P4 is turned off. Therefore, the power voltage VDDHO is no longer output to the output terminal OT1.

In contrast, when the non-volatile memory device 100 operates in an active mode, the gating enable signal GE of the low level L is provided to the gate terminal of the transistor P5. Accordingly, the transistor P5 is turned on, and the power voltage VDDLO is output to the output terminal OT1.

When the power voltage VDDLO is output to the output terminal OT1, the voltage level of the node A1 becomes the high level H, the voltage level of the node A3 becomes the low level L, the transistor N3 is turned off, and the transistor P4 is turned on. As a result, the power voltage VDDHO is output to the output terminal OT1.

Next, other operations of the power switch circuit will be described referring to FIGS. 5 to 8. Hereinafter, description will be made on the assumption that the gating enable signal GE of the low level L is provided to the gate terminal of the transistor P5.

FIGS. 5 to 8 are diagrams for explaining the operation of the power switch circuit.

Figure 5:
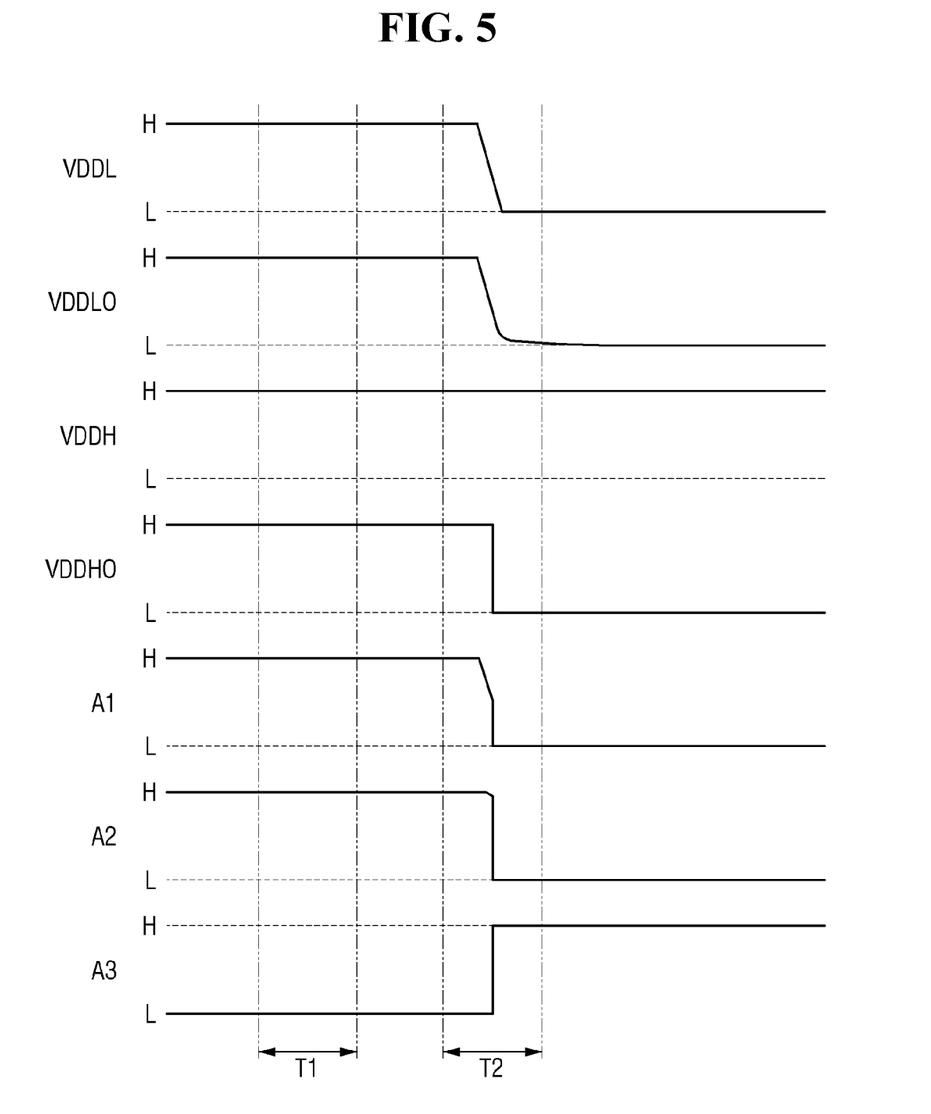
FIGS. 5 to 8 are diagrams for explaining the operation of an example power switch circuit.
Figure 6:
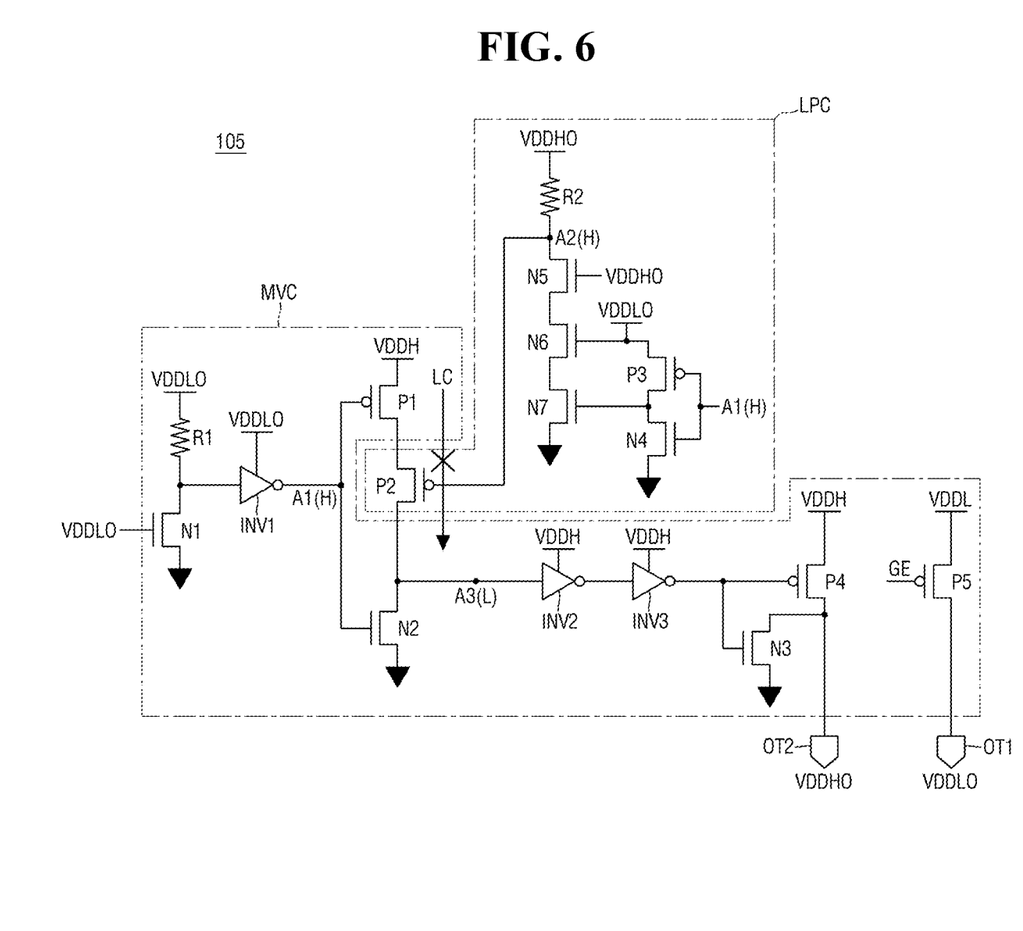

First, referring to FIGS. 5 and 6, at a first section T1, both the power voltage VDDH and the power voltage VDDL are provided to the power switch circuit 105. Since the power voltage VDDL is provided, the power voltage VDDLO is provided to the output terminal OT1.

When the transistor N1 is turned on in response to the provision of the power voltage VDDLO, since the voltage level of the input node of the inverter INV1 becomes the low level L by the pull-down resistance value generated by the transistor N1, and the inverter INV1 is driven by the power voltage VDDLO, the voltage level of the node A1 becomes the high level H.

When the voltage level of the node A1 becomes the high level H, the transistor P1 is turned off, the transistor N2 is turned on, and the voltage level of the node A3 becomes the low level L by the inverting operation. As a result, the transistor P4 is turned on, the transistor N3 is turned off, and the power voltage VDDHO is provided to the output terminal OT2.

On the other hand, when the voltage level of the node A1 becomes the high level H, the transistor N4 is turned on, and the transistor N7 is turned off As a result, the voltage level of the node A2 becomes the high level H of the power voltage level VDDHO.

When the voltage level of the node A2 becomes the high level H, the transistor P2 is turned off. As a result, the leakage current LC generated due to incomplete turning-off of the transistor P1 is cut off.

Figure 7:
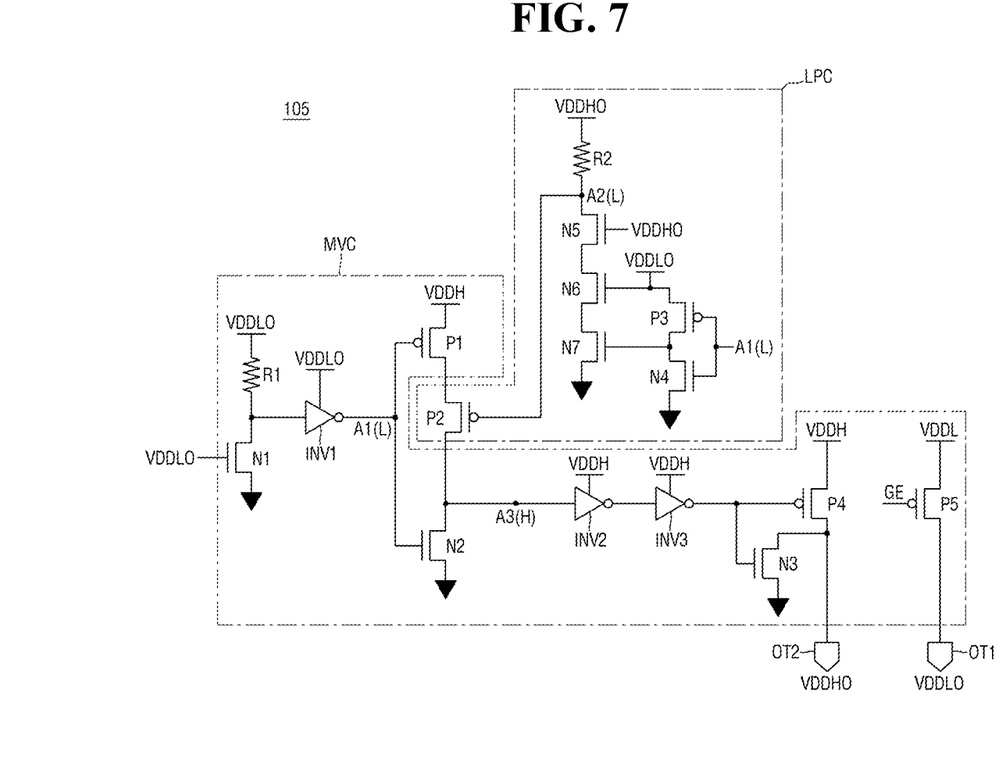

First, referring to FIGS. 5 and 7, at a second section T2, the power voltage VDDH is continuously provided but the power voltage VDDL is not provided to the power switch circuit 105.

Since the power voltage VDDL is not provided, the power voltage VDDLO may be very weakly provided to the output terminal OT1.

When the transistor N1 is turned off in response to the power voltage VDDLO being provided very weakly, since the voltage level of the input node of the inverter INV1 becomes the low level L, and the inverter INV1 also does not operate, the voltage level of the node A1 also becomes the low level L.

When the voltage level of the node A1 becomes the low level L, the transistor P1 is turned on and the transistor N2 is turned off.

On the other hand, when the voltage level of the node A1 becomes the low level L, the transistor P3 is turned on, and the transistor N6 and the transistor N7 are weakly turned by the power voltage VDDLO that is provided very weakly. Further, the transistor N5 is turned on by the power voltage VDDHO. The pull-down resistance value is generated by the transistors N5, N6, and N7 turned on in this way, and thus, the voltage level of the node A2 becomes the low level L.

When the voltage level of the node A2 becomes the low level L, the transistor P2 is turned on. As a result, the voltage level of the node A3 becomes the high level H by the power voltage VDDH.

When the voltage level of the node A3 becomes the high level H, the transistor P4 is turned off, the transistor N3 is turned on, and the power voltage VDDHO is not provided to the output terminal OT2. That is, when only the power voltage VDDH is provided and the power voltage VDDL is not provided to the power switch circuit 105, the power switch circuit 105 cuts off the power voltage VDDHO so that only the power voltage VDDHO is not solely provided to the output terminal OT2. Therefore, the operational stability of the non-volatile memory device 100 connected to the output terminals OT1 and OT2 may be improved.

Figure 8:
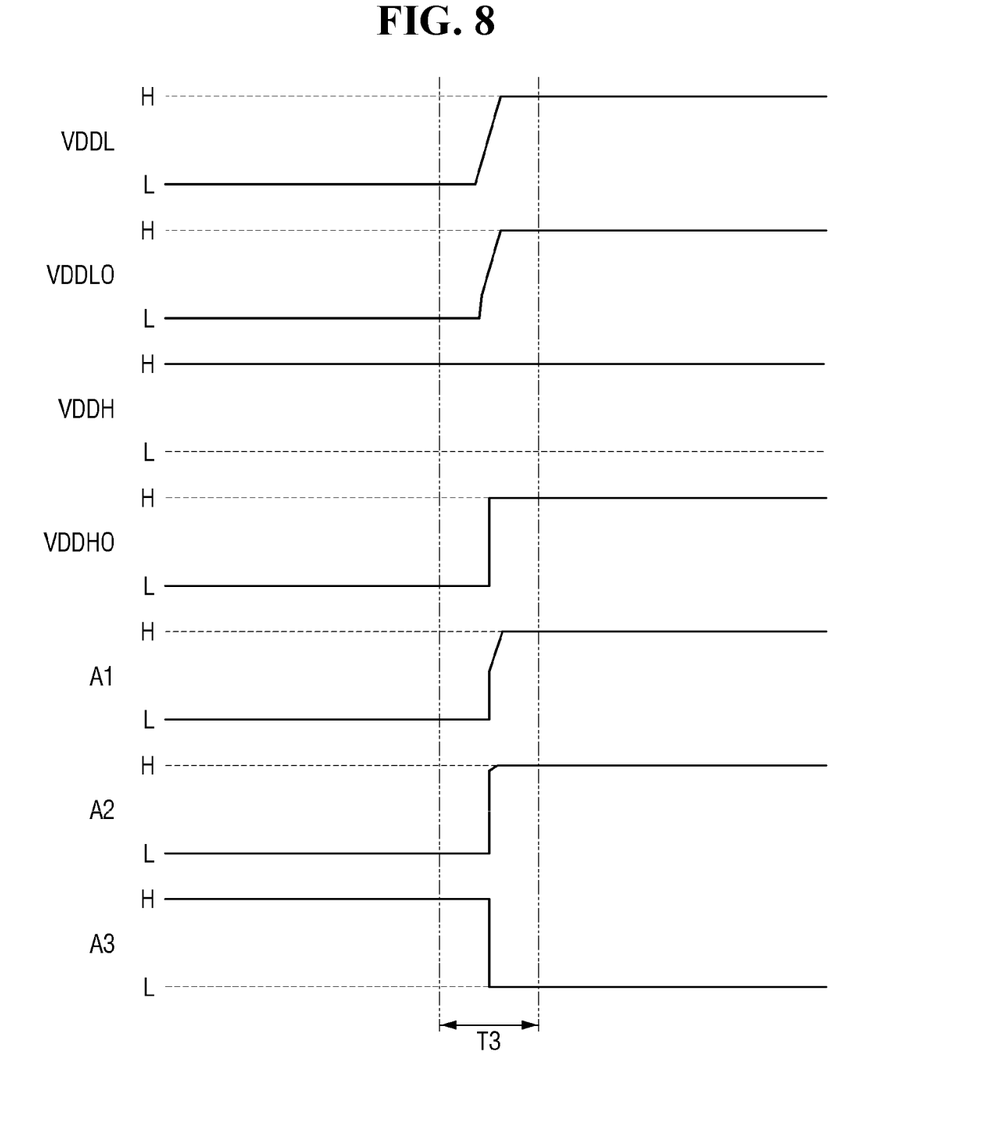

Next, referring to FIGS. 6 and 8, at a third section T3, the power voltage VDDL starts to be provided, while the power voltage VDDH is continuously provided to the power switch circuit 105.

Since the power voltage VDDL is provided, the power voltage VDDLO is provided to the output terminal OT1.

When the transistor N1 is turned on in response to the provision of the power voltage VDDLO, since the voltage level of the input node of the inverter INV1 becomes the low level L by the pull-down resistance value generated by the transistor N1, and the inverter INV1 is driven by the power voltage VDDLO, the voltage level of the node A1 becomes the high level H.

When the voltage level of the node A1 becomes the high level H, the transistor P1 is turned off, the transistor N2 is turned on, and the voltage level of the node A3 becomes the low level L by the inverting operation. As a result, the transistor P4 is turned on, the transistor N3 is turned off, and the power voltage VDDHO is provided to the output terminal OT2.

On the other hand, when the voltage level of the node A1 becomes the high level H, the transistor N4 is turned on, and the transistor N7 is turned off As a result, the voltage level of the node A2 becomes the high level H of the power voltage level VDDHO.

When the voltage level of the node A2 becomes the high level H, the transistor P2 is turned off. As a result, the leakage current LC generated due to incomplete turning-off of the transistor P1 is cut off.

In this way, the power switch circuit 105 according to the present embodiment may perform the power gating on the non-volatile memory device 100, and prevents only a power voltage of high voltage from being applied to the non-volatile memory device 100. Further, when the non-volatile memory device 100 is provided with the power voltage of high voltage and the power voltage of low voltage, the leakage current inside the non-volatile memory device 100 can be reduced.

Figure 9:
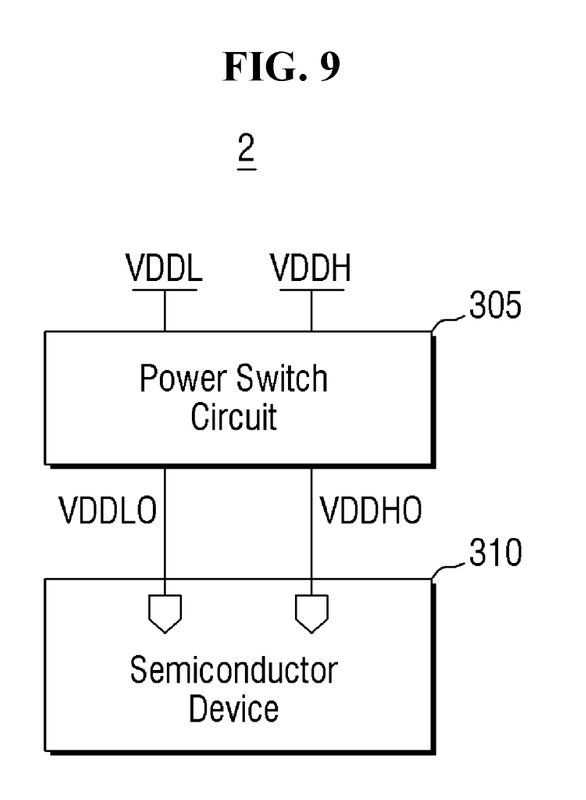
FIG. 9 is a block diagram for explaining a semiconductor system according to some embodiments.

FIG. 9 is a block diagram for explaining a semiconductor system according to some embodiments.

Referring to FIG. 9, a semiconductor system 2 includes a power switch circuit 305 and a semiconductor device 310.

The power switch circuit 305 receives the power voltage VDDL and the power voltage VDDH, and may output the power voltage VDDLO corresponding to the power voltage VDDL and the power voltage VDDHO corresponding to the power voltage VDDH to the semiconductor device 310. The power switch circuit 305 may include, for example, the same configuration as that of the power switch circuit (105 of FIG. 3) described above.

The semiconductor device 310 may operate using the power voltage VDDLO and the power voltage VDDHO greater than the power voltage VDDLO.

In some embodiments, the semiconductor device 310 may be a photographing device that captures a still image or moving image, such as a camera and a camcorder.

In some embodiments, the semiconductor device 310 may be a user input device that receives various types of data that are input from users, such as a touch pad, a key pad, a keyboard, a mouse, and a microphone.

In some embodiments, the semiconductor device 310 may be a sensor device that detects various types of physical quantities that may be acquired from outside the sensor device, and convert the detected physical quantities into electrical signals, such as a temperature sensor, a pressure sensor, an illuminance sensor, a position sensor, an acceleration sensor, a biosensor, and a gyroscope sensor.

In some embodiments, the semiconductor device 310 may be a communication device that performs transmission and reception of signal to and from other external devices according to various communication protocols.

In some embodiments, the semiconductor device 310 may be an output device that outputs visual and auditory information to the user, such as a display or speaker.

In some embodiments, the semiconductor device 310 may be a power supplying device that appropriately converts power supplied from a battery equipped in the semiconductor system 2 or an external power supply, and supplies the power to each constituent element of the semiconductor system 2.

In some embodiments, the semiconductor system 2 may be a mobile system such as mobile phone, a smart phone, a tablet PC (tablet personal computer), a wearable device, a healthcare device, or an Internet of Things (IOT) device. However, the semiconductor system 2 is not necessarily limited to a mobile system, and the semiconductor system 2 may be a personal computer, a laptop computer, a server, a media player, or an automotive device such as navigation device or system.

Figure 10:
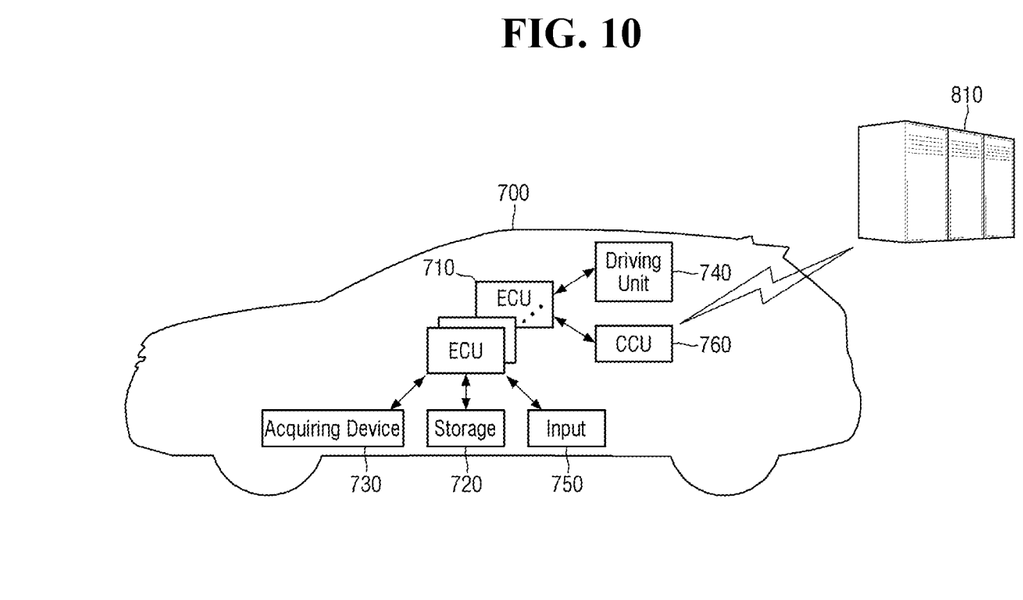
FIG. 10 is a diagram which shows a vehicle equipped with a memory system according to some embodiments.

FIG. 10 is a diagram which shows a vehicle equipped with a memory system like the ones described herein, according to some embodiments.

A vehicle 700 may include a plurality of electronic control units (ECU) 710, and a storage device 720.

Each electronic control device of the plurality of electronic control devices 710 is electrically, mechanically, and communicatively connected to at least one of a plurality of devices provided in the vehicle 700, and may control the operation of at least one device based on any one function execution command.

Here, the plurality of devices may include an acquiring device 730, such as a detector, that acquires information required to perform at least one function, and a driving unit 740 that performs at least one function.

For example, the acquiring device 730 may include various detecting units and image acquiring units. The driving unit 740 may include a fan and compressor of an air conditioner, a fan of a ventilation device, an engine and a motor of a power device, a motor of a steering device, a motor and a valve of a brake device, an opening/closing device of a door or a tailgate, and the like.

The plurality of electronic control devices 710 may communicate with the acquiring device 730 and the driving unit 740 using, for example, at least one of an Ethernet, a low voltage differential signaling (LVDS) communication, and a local interconnect network (LIN) communication.

The plurality of electronic control devices 710 determine whether there is a need to perform a function based on the information acquired through the acquiring device 730, and when it is determined that there is a need to perform the function, the plurality of electronic control devices 710 control the operation of the driving unit 740 that performs the function, and may control an amount of operation based on the acquired information. At this time, the plurality of electronic control devices 710 may store the acquired information in the storage device 720, or may read and use the information stored in the storage device 720. In some embodiments, the storage device 720 may adopt the non-volatile memory system 1 described above.

The plurality of electronic control devices 710 is able to control the operation of the driving unit 740 that performs the function based on the function execution command that is input based on information acquired through the acquiring unit 730, and is also able to check a setting amount corresponding to the information that is input based on information acquired through the acquiring unit 730 and control the operation of the driving unit 740 that performs the function based on the checked setting amount.

Each electronic control device 710 may control any one function independently, or may control any one function in cooperation with other electronic control devices.

For example, when a distance to an obstacle detected through a distance detection unit is within a reference distance, an electronic control device of a collision prevention device may output a warning sound for a collision with the obstacle through a speaker.

An electronic control device of an autonomous driving control device may receive navigation information, road image information, and distance information to obstacles in cooperation with the electronic control device of the vehicle terminal, the electronic control device of the image acquisition unit, and the electronic control device of the collision prevention device, and may control a power device, a brake device, and a steering device using the received information, thereby performing autonomous driving.

A connectivity control unit (CCU) 760 is electrically, mechanically, and communicatively connected to each of the plurality of electronic control devices 710, and communicates with each of the plurality of electronic control devices 710.

That is, the connectivity control unit 760 is able to directly communicate with a plurality of electronic control devices 710 provided inside the vehicle, is able to communicate with an external server, and is also able to communicate with an external terminal through an interface.

Here, the connectivity control unit 760 is able to communicate with the plurality of electronic control devices 710, and is able to communicate with a server 810, using an antenna (not shown) and a RF communication.

Further, the connectivity control unit 760 may communicate with the server 810 by wireless communication. At this time, the wireless communication between the connectivity control unit 760 and the server 810 may be performed through various wireless communication methods such as a GSM (Global System for Mobile Communication), a CDMA (Code Division Multiple Access), a WCDMA (Wideband Code Division Multiple Access), a UMTS (universal mobile telecommunications system), a TDMA (Time Division Multiple Access), and an LTE (Long Term Evolution), in addition to a Wifi module and a Wireless broadband module.

In concluding the detailed description, those skilled in the art will appreciate that many variations and modifications may be made to the preferred embodiments without substantially departing from the principles of the present disclosure. Therefore, the disclosed preferred embodiments of the disclosure are used in a generic and descriptive sense only and not for purposes of limitation.

What is claimed is:

1. A power switch circuit comprising:
a multi-voltage providing circuit configured to receive a first voltage different from zero and a second voltage greater than the first voltage, output a third voltage corresponding to the first voltage to a first output terminal, and output a fourth voltage corresponding to the second voltage to a second output terminal different from the first output terminal; and
a leakage current prevention circuit configured to cut off a leakage current flowing through the multi-voltage providing circuit,
wherein the multi-voltage providing circuit comprises a first inverter which is driven using the second voltage, and
wherein the leakage current prevention circuit is configured to cut off a leakage current flowing through the first inverter in response to both the first voltage and the second voltage being provided to the multi-voltage providing circuit.

2. The power switch circuit of claim 1, wherein the multi-voltage providing circuit is configured to not provide the fourth voltage to the second output terminal in response to the first voltage not being provided to the multi-voltage providing circuit and the second voltage being provided to the multi-voltage providing circuit.

3. The power switch circuit of claim 1, wherein the multi-voltage providing circuit further comprises a second inverter which is driven using the third voltage, and an output of which is provided to the first inverter.

4. The power switch circuit of claim 1, wherein the first inverter comprises:
a first transistor having a first terminal to which the second voltage is provided and a gate terminal connected to a first node, and
a second transistor having a first terminal that is grounded and a gate terminal connected to the first node,
wherein the leakage current prevention circuit comprises a third transistor connected to a second terminal of the first transistor and a second terminal of the second transistor, and
wherein the third transistor is connected between the first transistor and the second transistor.

5. The power switch circuit of claim 4, wherein the third transistor is turned off in response to the first node having a first voltage level, and
wherein the third transistor is turned on in response to the first node having a second voltage level.

6. The power switch circuit of claim 1, wherein the first inverter comprises:
a first transistor having a first terminal to which the second voltage is provided and a gate terminal connected to a first node, and
a second transistor having a first terminal that is grounded and a gate terminal connected to the first node,
wherein the leakage current prevention circuit is configured to cut off a leakage current flowing through the first inverter using a pull-down resistance value that is determined based on a voltage level of the first node.

7. The power switch circuit of claim 6, wherein the leakage current prevention circuit comprises:
a third transistor connected to a second terminal of the first transistor and a second terminal of the second transistor;
a fourth transistor having a first terminal to which the third voltage is provided, wherein the fourth transistor is turned on based on the voltage level of the first node;
a fifth transistor having a first terminal that is grounded and a second terminal connected to a second terminal of the fourth transistor, wherein the fifth transistor is turned on based on the voltage level of the first node; and
a sixth transistor having a gate terminal connected to the second terminal of the fourth transistor and the second terminal of the fifth transistor, wherein the sixth transistor is configured to determine the pull-down resistance value.

8. The power switch circuit of claim 7, wherein a voltage generated from the fourth voltage is provided to the gate terminal of the third transistor based on a first resistance value of a resistor in the leakage current prevention circuit and the pull-down resistance value.

9. The power switch circuit of claim 1, wherein the multi-voltage providing circuit comprises:
a first transistor configured to be turned on based on a gating enable signal and configured to output the third voltage to the first output terminal based on the first voltage, and
a second transistor configured to be turned on based on the output of the first inverter and configured to output the fourth voltage to the second output terminal based on the second voltage.

10. A power switch circuit comprising:
a multi-voltage providing circuit configured to receive a first voltage and a second voltage greater than the first voltage, output a third voltage corresponding to the first voltage to a first output terminal, and output a fourth voltage corresponding to the second voltage to a second output terminal, wherein the multi-voltage providing circuit comprises a first inverter which is driven using the second voltage; and
a leakage current prevention circuit configured to cut off a leakage current flowing through the first inverter using a pull-down resistance value determined based on a voltage level of an input node of the first inverter.

11. The power switch circuit of claim 10, wherein the multi-voltage providing circuit comprises:
a first transistor configured to be turned on based on a gating enable signal and configured to output the third voltage to the first output terminal based on the first voltage, and
a second transistor configured to be turned on based on the output of the first inverter and configured to output the fourth voltage to the second output terminal based on the second voltage.

12. The power switch circuit of claim 10, wherein the first inverter comprises:
a first transistor having a first terminal to which the second voltage is provided and a gate terminal connected to the input node, and a second transistor having a first terminal that is grounded and a gate terminal connected to the input node, wherein the leakage current prevention circuit comprises a third transistor which is connected to a second terminal of the first transistor and a second terminal of the second transistor, wherein the third transistor is turned on based on the pull-down resistance value.

13. The power switch circuit of claim 12, wherein the leakage current prevention circuit comprises:

a fourth transistor having a first terminal to which the third voltage is provided, wherein the fourth transistor is turned on based on the voltage level of the input node;

a fifth transistor having a first terminal that is grounded and a second terminal connected to a second terminal of the fourth transistor, wherein the fifth transistor is turned on based on the voltage level of the input node; and a sixth transistor having a gate terminal connected to the second terminal of the fourth transistor and the second terminal of the fifth transistor, wherein the sixth transistor is configured to determine the pull-down resistance value.

14. The power switch circuit of claim 13, wherein a voltage generated from the fourth voltage is provided to the gate terminal of the third transistor based on a first resistance value of a resistor in the leakage current prevention circuit and the pull-down resistance value.

15. The power switch circuit of claim 10, wherein the multi-voltage providing circuit is configured to not output the fourth voltage to the second output terminal in response to the first voltage not being provided to the multi-voltage providing circuit and the second voltage being provided to the multi-voltage providing circuit.

16. A non-volatile memory device comprising:

a power switch circuit configured to receive a first voltage and a second voltage greater than the first voltage, output a third voltage corresponding to the first voltage to a first output terminal, and output a fourth voltage corresponding to the second voltage to a second output terminal; and a voltage generator configured to receive the third voltage through the first output terminal, receive the fourth voltage through the second output terminal, and generate an operating voltage for reading and/or writing data on a memory cell based on the third voltage and the fourth voltage, wherein the power switch circuit comprises:

a first inverter which is driven using the second voltage, and a leakage current prevention circuit configured to reduce or inhibit a leakage current flowing through the first inverter using a pull-down resistance value determined based on a voltage level of an input node of the first inverter.

17. The non-volatile memory device of claim 16, wherein the first inverter comprises:

a first transistor having a first terminal to which the second voltage is provided and a gate terminal connected to the input node, and a second transistor having a first terminal that is grounded and a gate terminal connected to the input node, wherein the leakage current prevention circuit comprises a third transistor which is connected to a second terminal of the first transistor and a second terminal of the second transistor and is turned on based on the pull-down resistance value.

18. The non-volatile memory device of claim 17, wherein the leakage current prevention circuit comprises:

a fourth transistor having a first terminal to which the third voltage is provided, wherein the fourth transistor is turned on based on the voltage level of the input node;

a fifth transistor having a first terminal that is grounded and a second terminal connected to a second terminal of the fourth transistor, wherein the fifth transistor is turned on based on the voltage level of the input node, and a sixth transistor having a gate terminal connected to the second terminal of the fourth transistor and the second terminal of the fifth transistor, wherein the sixth transistor is configured to determine the pull-down resistance value.

19. The non-volatile memory device of claim 16, wherein the power switch circuit is configured to not provide the fourth voltage to the second output terminal in response to the first voltage not being provided to the power switch circuit and the second voltage being provided to the power switch circuit.

20. The non-volatile memory device of claim 16, wherein the power switch circuit comprises:

a first transistor configured to be turned on based on a gating enable signal and configured to output the third voltage to the first output terminal based on the first voltage, and a second transistor configured to be turned on based on the output of the first inverter and configured to output the fourth voltage to the second output terminal based on the second voltage.

* * * * *